United States Patent
Weimer et al.

(10) Patent No.: US 8,294,192 B2
(45) Date of Patent: Oct. 23, 2012

(54) USE OF DILUTE STEAM AMBIENT FOR IMPROVEMENT OF FLASH DEVICES

(75) Inventors: Ronald A. Weimer, Boise, ID (US); Don C. Powell, Boise, ID (US); John T. Moore, Boise, ID (US); Jeff A. McKee, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/168,902

(22) Filed: Jun. 24, 2011

(65) Prior Publication Data

US 2011/0254075 A1 Oct. 20, 2011

Related U.S. Application Data

(60) Continuation of application No. 12/534,054, filed on Jul. 31, 2009, now Pat. No. 7,989,870, which is a continuation of application No. 12/204,603, filed on Sep. 4, 2008, now Pat. No. 7,585,725, which is a division of application No. 11/205,772, filed on Aug. 17, 2005, now Pat. No. 7,432,546, which is a continuation of application No. 10/013,322, filed on Nov. 13, 2001, now Pat. No. 6,949,789, which is a division of application No. 09/648,699, filed on Aug. 25, 2000, now Pat. No. 6,348,380.

(51) Int. Cl.
*H01L 21/336* (2006.01)

(52) U.S. Cl. ............... 257/315; 257/E21.209; 438/257; 365/185.01

(58) Field of Classification Search .......... 257/315, 257/320–325; 438/257; 365/185.01
See application file for complete search history.

(56) References Cited

U.S. PATENT DOCUMENTS

| | | | |
|---|---|---|---|
| 4,769,340 A | 9/1988 | Chang et al. |
| 4,980,307 A | 12/1990 | Ito et al. |
| 5,120,670 A | 6/1992 | Bergmont |
| 5,132,756 A | 7/1992 | Matsuda |
| 5,292,673 A | 3/1994 | Shinriki et al. |
| 5,360,760 A | 11/1994 | Hayashi |
| 5,360,769 A | 11/1994 | Thakur et al. |
| 5,376,593 A | 12/1994 | Sandhu et al. |
| 5,393,676 A | 2/1995 | Anjum et al. |
| 5,393,683 A | 2/1995 | Mathews et al. |
| 5,405,791 A | 4/1995 | Ahmad et al. |
| 5,405,805 A | 4/1995 | Homma |
| 5,407,870 A | 4/1995 | Okada et al. |

(Continued)

OTHER PUBLICATIONS

Muramatsu et al., "The Solution of over-erase problem controlling Poly-Si grain size-Modified scaling principles for Flash Memory". IEEE Tehnical Digest IEDM 1994, pp. 847-850.

*Primary Examiner* — Jami M Valentine
(74) *Attorney, Agent, or Firm* — Knobbe Martens Olson & Bear LLP

(57) ABSTRACT

A flash memory integrated circuit and a method for fabricating the same. A gate stack includes an initial oxide layer directly in contact with a silicon layer, defining an oxide-silicon interface therebetween. Additional oxide material is formed substantially uniformly along the oxide-silicon interface. Polysilicon grain boundaries at the interface are thereby passivated after etching. The interface can be formed between a tunnel oxide and a floating gate, and passivating the grain boundaries reduces erase variability. Oxide in an upper storage dielectric layer is enhanced in the dilute steam oxidation. The thin oxide layers serve as diffusion paths to enhance uniform distribution of OH species across the buried interfaces being oxidized.

14 Claims, 8 Drawing Sheets

U.S. PATENT DOCUMENTS

| | | |
|---|---|---|
| 5,434,813 A | 7/1995 | Tamura et al. |
| 5,756,392 A | 5/1998 | Lu et al. |
| 5,837,585 A | 11/1998 | Wu et al. |
| 5,840,607 A | 11/1998 | Yeh et al. |
| 6,046,085 A | 4/2000 | Chan |
| 6,063,666 A | 5/2000 | Chang et al. |
| 6,071,784 A | 6/2000 | Mehta et al. |
| 6,096,604 A | 8/2000 | Cha et al. |
| 6,153,470 A | 11/2000 | He et al. |
| 6,255,205 B1 | 7/2001 | Sung |
| 6,348,380 B1 | 2/2002 | Weimer et al. |

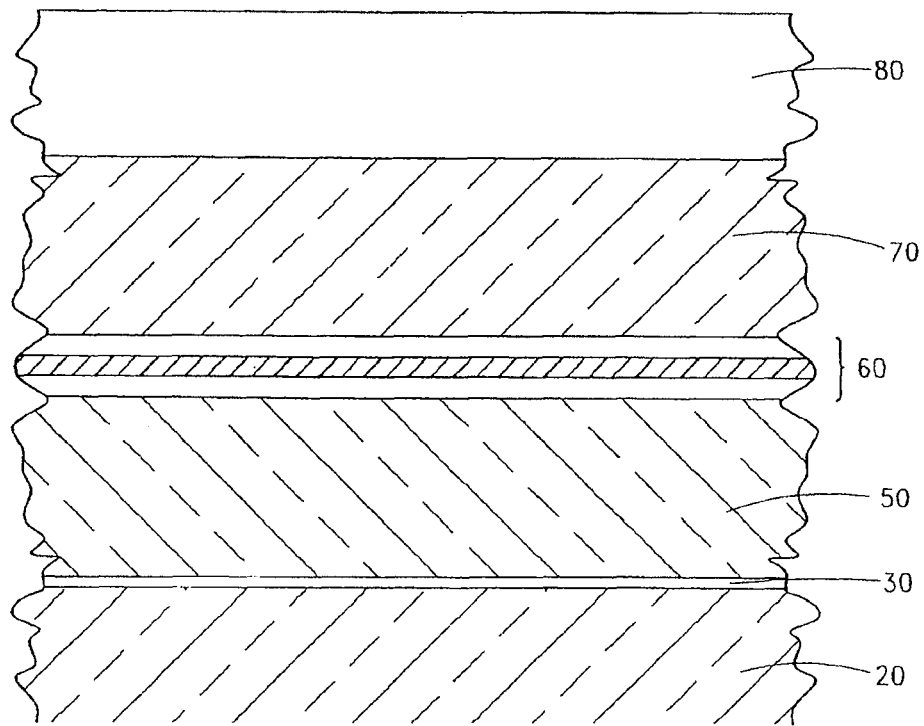
FIG. 3
(Prior Art)
FIG. 4
(Prior Art)
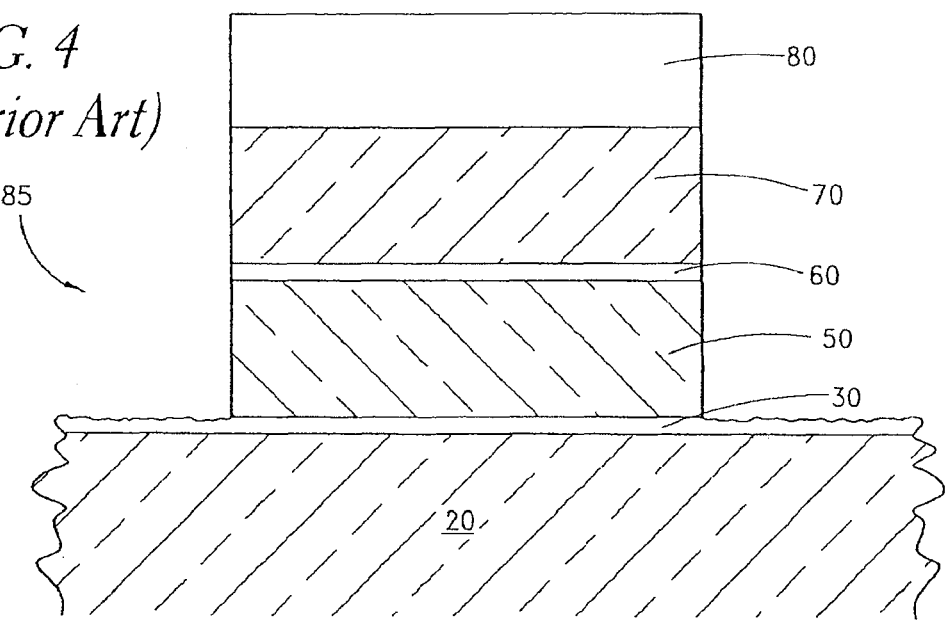

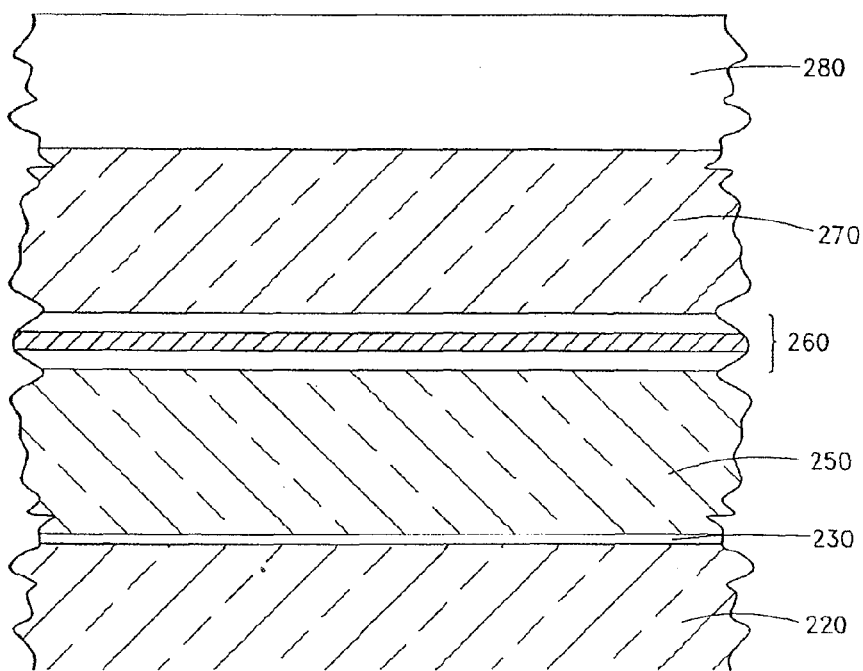
FIG. 8
FIG. 9
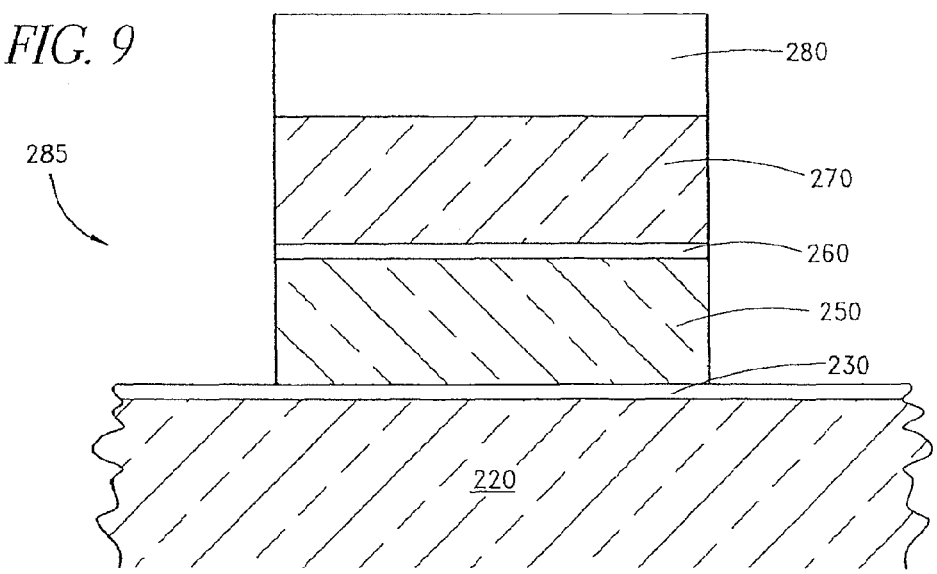

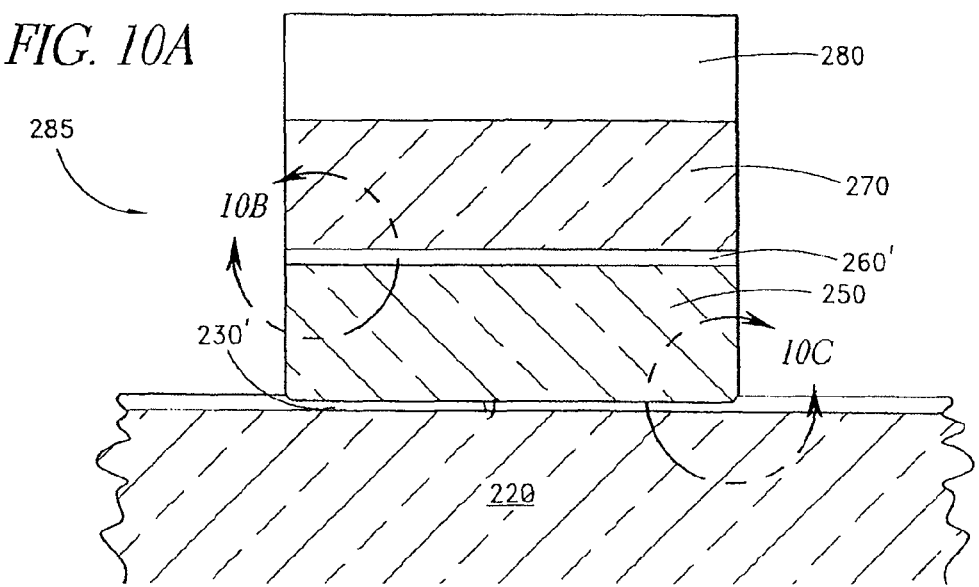
FIG. 10A
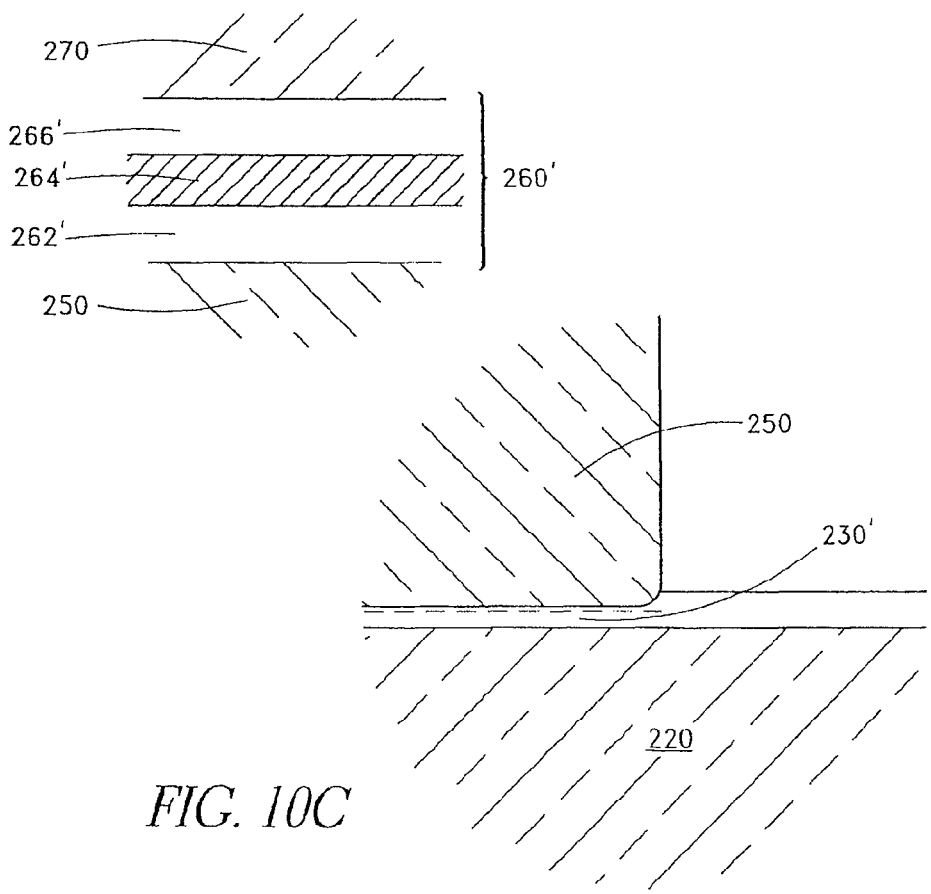
FIG. 10B
FIG. 10C

USE OF DILUTE STEAM AMBIENT FOR IMPROVEMENT OF FLASH DEVICES

CLAIM OF PRIORITY

This application is a continuation of U.S. patent application Ser. No. 12/534,054, filed Jul. 31, 2009, which is a continuation of U.S. patent application Ser. No. 12/204,603, filed Sep. 4, 2008, which is a divisional of U.S. patent application Ser. No. 11/205,772, filed Aug. 17, 2005, and issued as U.S. Pat. No. 7,432,546, which is a continuation of U.S. patent application Ser. No. 10/013,322, filed Nov. 13, 2001, and issued as U.S. Pat. No. 6,949,789, which is a divisional of U.S. patent application Ser. No. 09/648,699, filed Aug. 25, 2000, and issued as U.S. Pat. No. 6,348,380, the disclosures of which are hereby incorporated in their entirety by reference herein.

FIELD OF THE INVENTION

The present invention generally relates to transistor gate dielectrics and methods of fabricating the same. More particularly, the invention relates to processes and structures for improving tunnel oxide quality in erasable programmable read-only memories (EEPROMs).

BACKGROUND OF THE INVENTION

Memory devices such as erasable programmable read-only memories (EPROMs), electrically erasable programmable read-only memories (EEPROMs), or flash erasable programmable read-only memories (FEPROMs) are erasable and reusable memory cells which are often used in digital cellular phones, digital cameras, LAN switches, cards for notebook computers, etc. A memory cell operates by storing electric charge (representing an "on" state) on an electrically isolated floating gate, which is incorporated into a transistor. This stored charge affects the behavior of the transistor, thereby providing a way to read the memory element. It is therefore crucial that the memory cell be able to maintain the stored charge over time, so that charge leakage does not cause data errors by converting "on" states to "off."

A flash memory cell typically consists of a transistor, a floating gate, and a control gate above the floating gate in a stacked gate structure. The floating gate, typically composed of polycrystalline silicon (i.e., "polysilicon"), is electrically isolated from the underlying semiconductor substrate by a thin dielectric layer, which is typically formed of an insulating oxide, and more particularly, silicon oxide. Because charge is transferred across the dielectric layer by quantum-mechanical tunneling, this dielectric layer is often referred to as a "tunnel oxide" layer. Such tunnel oxide layers are typically approximately 100 Å thick. Properties of the tunnel oxide must be strictly controlled to ensure the ability to read and write by tunneling, while avoiding data loss through charge trapping or leakage. The control gate is positioned above the floating gate, and is electrically isolated from the floating gate by a storage dielectric layer, such as oxide-nitride-oxide (ONO). Electrical access to the floating gate is therefore only through capacitors.

Storing charge on the floating gate programs a memory cell. This is achieved via hot-electron injection by applying a high positive voltage (approximately 12 V) to the control gate, and a high drain-to-source bias voltage (approximately 6 V). An inversion region is created between the source and drain by the control gate voltage, and electrons are accelerated from the source to the drain by the drain bias voltage. Some fraction of these electrons will have sufficient energy to surmount the tunnel oxide barrier height and reach the floating gate. The floating gate is therefore programmed by collecting and storing these electrons to represent an "on" state.

An EPROM device can be erased (i.e., returned to an "off" state) by exposing the floating gate to ultraviolet light, which excites the stored electrons out of the floating gate. The erasure of an EEPROM or FEPROM cell is accomplished via Fowler-Nordheim tunneling, in which an electric field is applied which is sufficient for the stored electrons to traverse the tunnel oxide and enter the substrate, thereby reducing the stored charge in the floating gate. Under this mechanism for discharging the floating gate, a large negative voltage (e.g., −10 V) is applied to the control gate, and a positive voltage (e.g., 5-6 V) is applied to the source while the drain is left floating. Electrons then tunnel from the floating gate through the tunnel oxide, and are accelerated into the source. Because both the programming and erasing of a memory element takes place via charge transfer processes across the tunnel oxide layer, it is important to minimize the density of interface states and other defects in the form of charge traps in this region which would otherwise create a mechanism for charge trapping or leakage through the tunnel oxide.

Once the stacked gate structure has been fabricated and etched to the appropriate dimensions, the stacked gate structure is encapsulated in a liner layer, followed by the formation of an insulating layer, typically composed of thick, planarized borophosphosilicate glass (BPSG). The liner layer between the source/drain regions and the BPSG, often composed of a low pressure chemical vapor deposition (LPCVD) oxide, serves to minimize out-diffusion of contaminants and dopants from the BPSG. Such out-diffusion might otherwise affect the performance of underlying devices.

While processes have been developed to improve gate dielectric quality, as measured by improved data retention in flash memory devices, for example, a finite soft error rate remains. Accordingly a need exists for further improvements in the fabrication of transistor gate dielectrics.

SUMMARY OF THE INVENTION

In accordance with one aspect of the present invention, a method is provided for fabricating an integrated circuit. The method includes providing a silicon semiconductor substrate and forming a stacked gate structure comprising an oxide-silicon interface defined by an initial oxide layer directly in contact with a silicon layer. Upon patterning the stacked gate structure to define a gate stack that includes the oxide-silicon interface, a final oxide layer is formed with additional silicon oxide bonds in the region of the oxide-silicon interface. This result is achieved by exposing the patterned gate stack to elevated temperatures and a dilute steam ambient.

In accordance with another aspect of the invention, a method is provided for fabricating an integrated circuit. The method includes providing a semiconductor substrate and forming a transistor gate stack that includes an oxide-silicon interface between an initial oxide layer and an overlying polycrystalline silicon layer. The transistor gate stack is etched to define a gate electrode that includes the oxide-silicon interface. Polycrystalline silicon grain boundaries are then passivated across the oxide-silicon interface by exposing the grain boundaries to OH species.

In accordance with yet another aspect of the invention, a method is provided for fabricating an integrated circuit. The method includes forming a plurality of layers over a semiconductor substrate, including a buried oxide layer having an interface with a silicon source layer. The plurality of layers is etched to expose a surface of the buried oxide layer. Then, OH species diffuse through the surface across the interface with the silicon source layer to grow additional oxide.

In accordance with yet another aspect of the invention, an integrated circuit includes a transistor with a polysilicon layer directly in contact with an oxide layer, forming an oxide-polysilicon interface between these layers. Along the interface, polysilicon grain boundaries include oxide bonds.

In the illustrated embodiments, a stacked gate structure is formed on the surface of a silicon semiconductor substrate, wherein the stacked gate structure comprises an initial tunnel dielectric layer, one or more polysilicon layers, and an initial storage dielectric layer comprising one or more initial oxide layers. After patterning, the stacked gate structure is exposed to elevated temperatures and a dilute steam ambient comprising steam and hydrogen. This dilute steam ambient process yields OH radicals which readily diffuse through the initial oxide and form additional oxide material substantially uniformly along the oxide-silicon interfaces of the stacked gate structure. The oxidation rate is controlled by diluting the steam with carrier and preferably hydrogen-bearing gas, and by keeping the oxidation temperature moderate. As a result, oxidation is slower relative to the lateral diffusion of OH species from the gate sidewalls across the entire interface. The final tunnel dielectric layer thus has a substantially uniform thickness. Most preferably, the oxide thickness of a storage dielectric layer is simultaneously increased.

Advantageously, the exposure of the stacked gate structure to the dilute steam ambient improves the performance of the resulting device structures. First, the number of defects, such as oxygen vacancies and dangling bonds, in the region of the final tunnel dielectric layer is reduced by the additional oxide material. Second, consumption of thermal budget can be dramatically reduced due to the relatively low temperatures and time of the dilute steam ambient oxidation in forming a substantial fraction of the final storage dielectric layer. And third, the grain boundaries of polysilicon layers within the stacked gate structure are passivated during the dilute steam oxidation, thereby reducing the effect of the grain boundaries on the erase characteristics of the resulting devices.

BRIEF DESCRIPTION OF THE DRAWINGS

FIG. 3 schematically illustrates the stacked gate structure of FIG. 2A after formation of a control gate and a cap insulator layer, in accordance with the prior art.

FIG. 4 schematically illustrates the stacked gate structure of FIG. 3 after patterning and etching to define.

FIG. 8 schematically illustrates the stacked gate structure of FIG. 7A after formation of a control gate and a cap insulator layer.

FIG. 9 schematically illustrates the stacked gate structure of FIG. 8 after patterning and etching, but before exposure to a dilute steam ambient.

FIGS. 10A to 10C schematically illustrate the patterned gate of FIG. 9 after the exposure to a dilute steam ambient.

DETAILED DESCRIPTION OF THE PREFERRED EMBODIMENT

While illustrated in the context of an electrically erasable programmable read only memory (EEPROM) device for flash memory circuits, persons skilled in the art will readily find application for the present invention to fabrication of other semiconductor integrated circuit devices. In particular, methods disclosed herein are applicable to improving dielectric-conductor interfaces in a wide variety of device designs with a wide variety of process flows. The methods described herein, however, have particular utility for improving the performance of dielectric layers in flash memory gate stacks.

Figure 1:
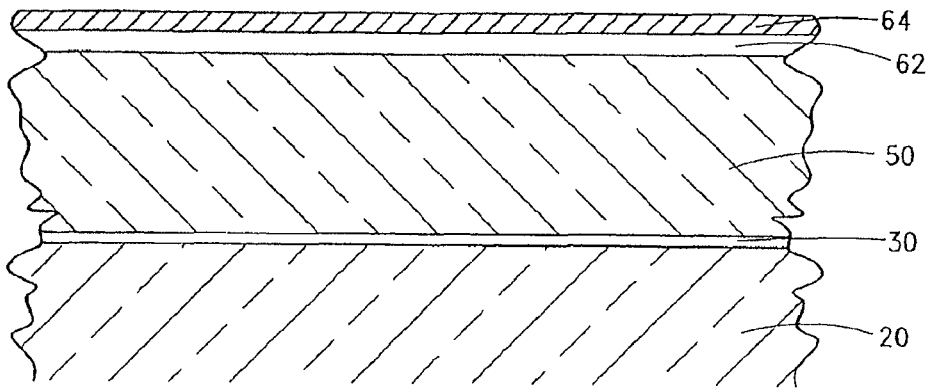
FIG. 1 schematically illustrates an interim stage of the fabrication of the stacked gate structure with a nitride layer on top of a lower oxide layer, in accordance with prior art methods.

FIG. 1 illustrates an interim structure during the fabrication of an EEPROM transistor 10 in a flash memory cell constructed using prior art methods. The EEPROM transistor 10 includes a stacked gate structure 26 fabricated over a semiconductor substrate 20, which in the illustrated embodiments (and the prior art figures) is formed from the upper portion of a single-crystal silicon wafer. The interim stage of the stacked gate structure 26 illustrated in FIG. 1 includes a tunnel dielectric layer 30, a floating gate 50, and a partially formed storage dielectric layer 60 that includes a lower oxide layer 62 and a nitride layer 64.

The fabrication of the interim stacked gate structure 26 begins with the formation of a tunnel dielectric layer 30 by blanket formation across the whole exposed surface of the substrate 20. The tunnel dielectric layer 30 typically comprises an oxide, and more particularly silicon dioxide formed by thermal oxidation of the substrate surface. The tunnel dielectric layer 30 is formed to a thickness of approximately 100 Å.

The layers of the stacked gate structure 26 can be completed in any suitable fashion, typically entailing numerous processing steps. The formation of the floating gate 50 on the tunnel dielectric layer 30 is achieved by depositing a conductive layer (typically doped polysilicon) onto the tunnel dielectric layer 30. Doping of the polysilicon of the floating gate 50 can be either in situ (i.e., while the floating gate 50 is being formed) or it can be a separate step after the polysilicon deposition. Persons skilled in the art are able to select appropriate materials and methods for creating the floating gate 50 with a particular set of characteristics.

The formation of the stacked gate structure 26 continues by the formation of a storage dielectric layer 60 on the floating gate 50. An exemplary storage dielectric layer 60 is composed of oxide-nitride-oxide (ONO). Alternatively, high dielectric materials may be employed in the storage dielectric layer 60 to improve the capacitance of the EEPROM device. Persons skilled in the art can readily select appropriate materials for the storage dielectric layer 60 for particular circuit designs.

Figure 2A:
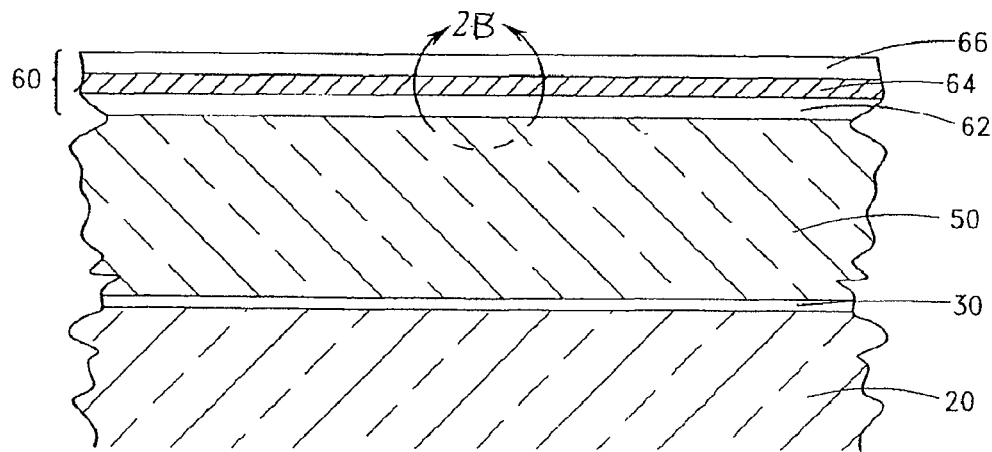
FIGS. 2A and 2B schematically illustrate the stacked gate structure of FIG. 1 after formation of an upper oxide layer on top of the nitride layer.
Figure 2B:
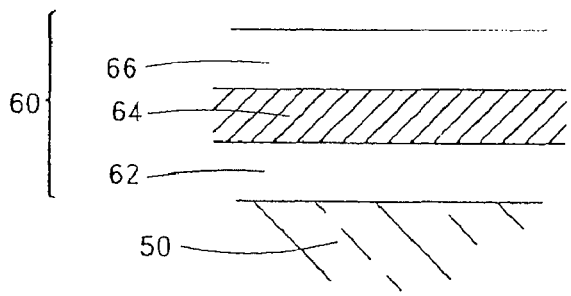

The formation of the ONO storage dielectric layer 60 as illustrated in FIGS. 1, 2A and 2B comprises formation of a lower oxide layer 62, a nitride layer 64 on top of the lower oxide layer 62, and an upper oxide layer 66 on top of the nitride layer 64. The lower oxide layer 62 is typically formed by thermal oxidation at the upper surface of the floating gate 50 until this sub-layer reaches its desired final thickness (e.g., 40 Å to 50 Å thick).

The formation of the nitride layer 64 is typically accomplished by low pressure chemical vapor deposition (LPCVD), but other fabrication processes to form the nitride layer 64 may be used. Typically, the thickness of the formed nitride layer 64 is approximately 70 Å, as illustrated in FIG. 1.

After formation of the nitride layer 64, the upper oxide layer 66 is formed on top of the nitride layer 64, as illustrated in FIGS. 2A and 2B. Growth of the upper oxide layer 66 is typically achieved by thermal oxidation at the top of the nitride layer 64, which requires relatively high temperatures and long processing times. The upper oxide layer 66 is formed at the expense of a portion of the nitride layer 64, which is partially consumed during oxidation. For example, formation of an upper oxide layer 66 that is 40 Å thick will consume approximately 40 Å of the nitride layer 64. Therefore, an initial nitride layer thickness of 70 Å is required to form an upper oxide layer 66 that is 40 Å thick and a resultant nitride layer thickness of 30 Å, as illustrated in FIGS. 2A and 2B. Typically, this process requires heating the substrate 20 to approximately 1,000° C. in an ambient of $H_2O$ and $O_2$ and at a pressure of approximately 760 Torr for a period of approximately 4 hours to 6 hours in a typical furnace oxidation.

Referring to FIG. 3, the formation of the gate stack then continues with the formation of a control gate 70 over the storage dielectric layer 60 and a cap insulator layer 80 on top of the control gate 70 to complete the gate stack. The control gate 70 is composed of polysilicon, however, various other conductive materials may be used, including but not limited to, metals (e.g., tungsten) and metal silicides. The cap insulator layer 80 typically comprises an insulator such as silicon nitride or silicon oxide.

Figure 5A:
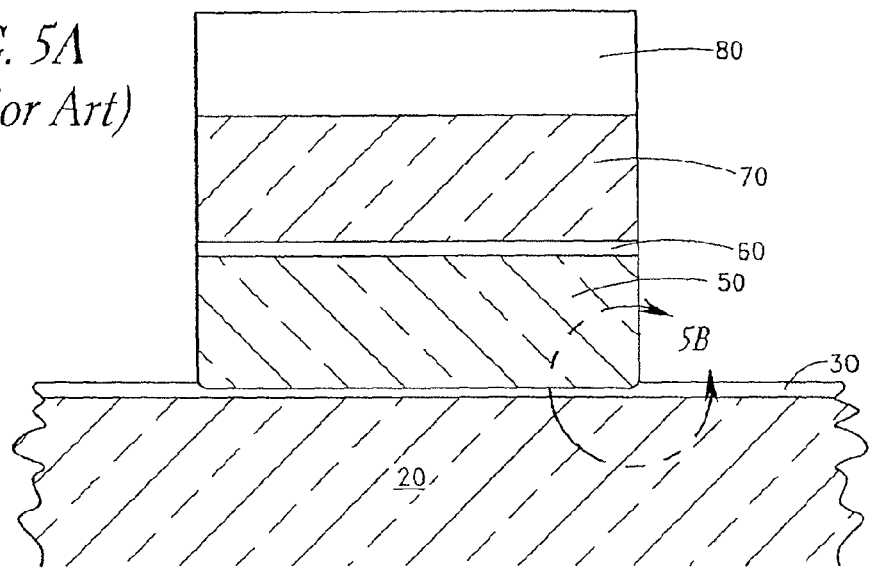
FIGS. 5A and 5B schematically illustrate the fabrication of the stacked gate structure of FIG. 4 after a prior art source/drain reoxidation.
Figure 5B:
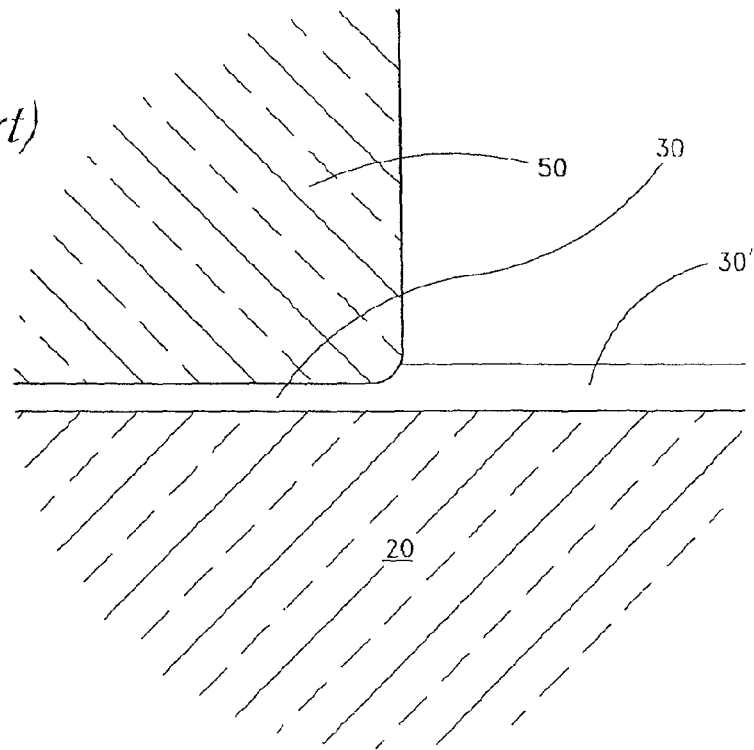

As illustrated in FIG. 4, the stacked gate structure is then patterned, typically by conventional photolithography and etch processes, to define a patterned gate electrode 85. The etching which forms the stacked gate structure 26 stops approximately at the tunnel dielectric layer 30 over source and drain regions on either side of the gate 85. Damage from the etch is thereafter repaired in a source/drain reoxidation, typically by exposure to dry oxygen at high temperatures. The resulting structure, illustrated in FIGS. 5A and 5B, exhibits some "smile" at the oxide-silicon interface, or gate corner rounding. "Smile" is the term for structures in which the edges of an oxide layer are thicker than the center of the oxide layer. The thicker oxide at the edges of the tunnel dielectric layer 30 and the rounding of the bottom corners of the floating gate 50 result from the low diffusion rate and high reaction rate of $O_2$. Both the low diffusion rate and the high reaction rate increase the probability that an $O_2$ molecule diffusing along the oxide-silicon interface will form an oxide species before it reaches the center of the interface, such that the edges of the oxide layer become thicker than the center.

The elevated temperatures and long processing times associated with the formation of the gate stack, particularly during the formation of the upper oxide layer 66, have a deleterious effect on previously fabricated components of the EEPROM transistor 10. For example, it is important to avoid reduced charge mobilities in the region of the tunnel dielectric layer 30, particularly in flash memory devices which utilize a complete channel erase. Exposure to elevated temperatures and long processing times create various forms of charge traps (e.g., vacancies and dangling bonds) in the region of the tunnel dielectric layer 30. In order to minimize the effects of such charge traps in the performance of the fabricated devices, it is desirable to be able to repair or passivate the charge traps created in the region of the tunnel dielectric layer 30 during the fabrication process. Additionally, it is generally desirable to minimize the time the device is exposed to elevated temperatures during its fabrication (i.e., to conserve the "thermal budget") to thereby reduce the number of charge traps created.

Figure 6:
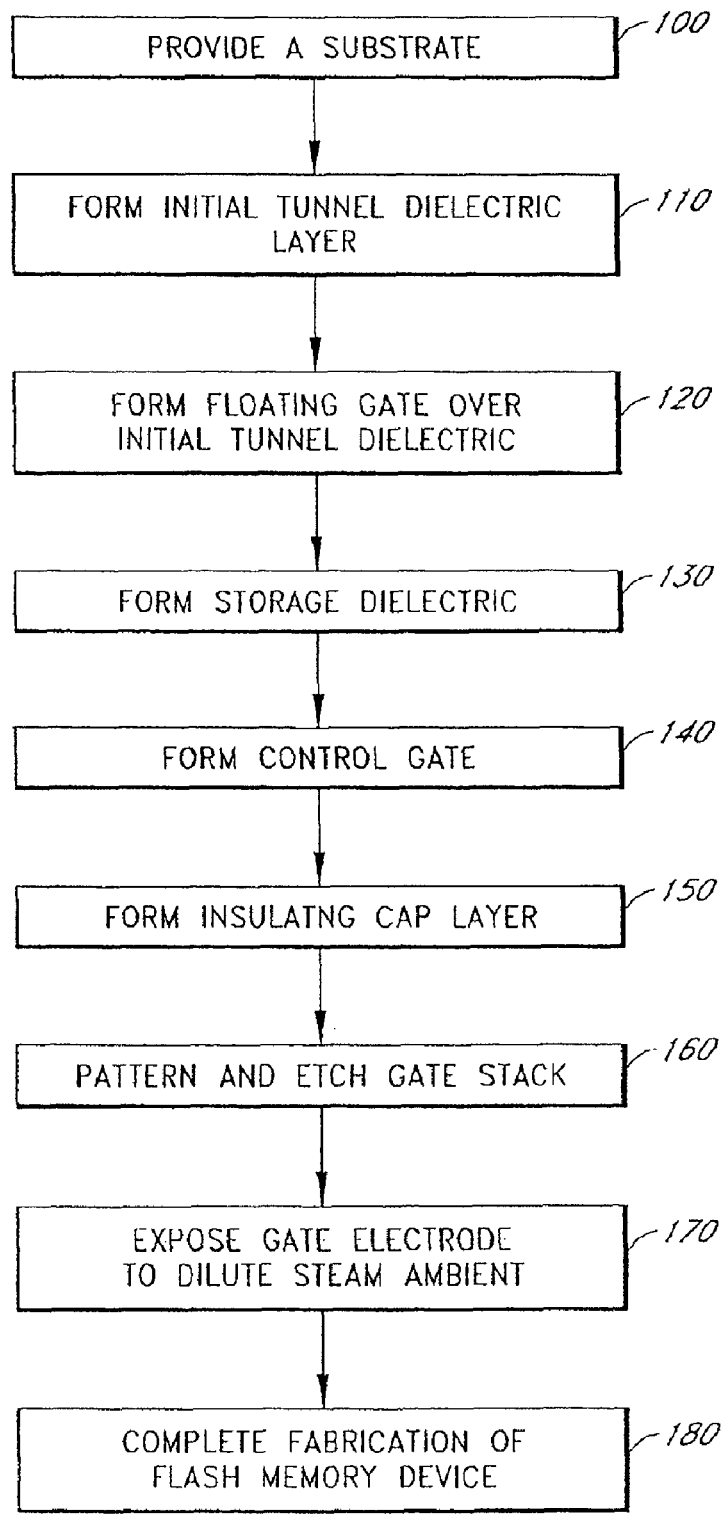
FIG. 6 is a flow chart, generally illustrating a process flow in accordance with a preferred embodiment of the present invention.

FIG. 6 is a flow chart which generally illustrates a process flow in accordance with one preferred embodiment of the present invention, and FIGS. 7A to 12 illustrate various stages of the fabrication of an EEPROM transistor in accordance with this preferred embodiment. In the following description of the preferred embodiment, the named process flow steps are found in FIG. 6 and the numbered structural elements refer to FIGS. 7A-12. It will be understood, however, that elements may differ in appearance during fabrication as compared to the illustrated final structure.

As in the prior art methods, the EEPROM transistor 10 produced by the preferred embodiment of the present invention is fabricated over a semiconductor substrate 220. FIG. 6 includes providing 100 such a semiconductor substrate 220. In the illustrated embodiment, the substrate 220 comprises the upper portion of a single-crystal silicon wafer. In general, however, the substrate can comprises any semiconductor structure or layer in which the lowest level of integrated electrical devices are formed.

The fabrication of the gate stack begins with the formation 110 of an initial tunnel dielectric layer 230 across the whole exposed surface of the substrate 220. The thickness of this initial tunnel dielectric layer 230 is less than the desired final thickness. The initial tunnel dielectric layer 230 preferably comprises an oxide, and more particularly silicon oxide, though the skilled artisan will appreciate that the present invention will have utility in conjunction with other types of oxide. An exemplary alternative oxide comprises tantalum pentoxide ($Ta_2O_5$). In the illustrated embodiment, formation 110 of the initial tunnel dielectric layer 230 comprises thermal oxidation of the substrate surface, but persons skilled in the art are able to select an appropriate method of forming the initial tunnel dielectric layer 230 from the various possible methods. The thickness of the illustrated initial tunnel dielectric layer 230 after this step in the fabrication of the stacked gate structure 26 is preferably between about 6 Å and 94 Å, (e.g., for a flash memory device with a final tunnel dielectric thickness of 100 Å). More generally, the initial tunnel dielectric layer 230 is grown to a thickness sufficient to provide a diffusion path for OH species. Preferably it has a thickness between about 5% and 95% of the thickness of the desired final thickness for this layer, more preferably between about 40% and 90% of the thickness of the desired final thickness, and most preferably between about 70% and 90% of the desired final thickness.

The remaining layers of the gate stack can be completed in any suitable fashion, typically entailing numerous processing steps. In the illustrated embodiment, formation 120 of a floating gate 250 is achieved by depositing a conductive layer (preferably doped polysilicon) onto the initial tunnel dielectric layer 230. As with the prior art method, the doping of the polysilicon of the floating gate 250 can be either in situ (i.e., while the floating gate 250 is being formed) or it can be a separate step after the polysilicon deposition. Persons skilled in the art are able to select appropriate materials and methods compatible with the present invention for creating the floating gate 250 with a particular set of characteristics.

The formation of the gate stack structure 26 of the preferred embodiment continues with at least partial formation 130 of a storage dielectric layer 260 on the floating gate 250. In the illustrated embodiment, an initial storage dielectric layer 260 includes an oxide and is particularly composed of oxide-nitride-oxide (ONO). Significantly, this initial layer 260 is originally formed to have a thickness which is less than the thickness of the desired final thickness. Alternatively, high dielectric materials may be employed in the storage dielectric to improve the capacitance of the EEPROM device. Persons skilled in the art can readily select appropriate materials for the storage dielectric layer for particular circuit designs. In other embodiments of the present invention in which the storage dielectric contains no oxide layers, the storage dielectric layer can be completely formed with its desired final thickness.

Figure 7A:
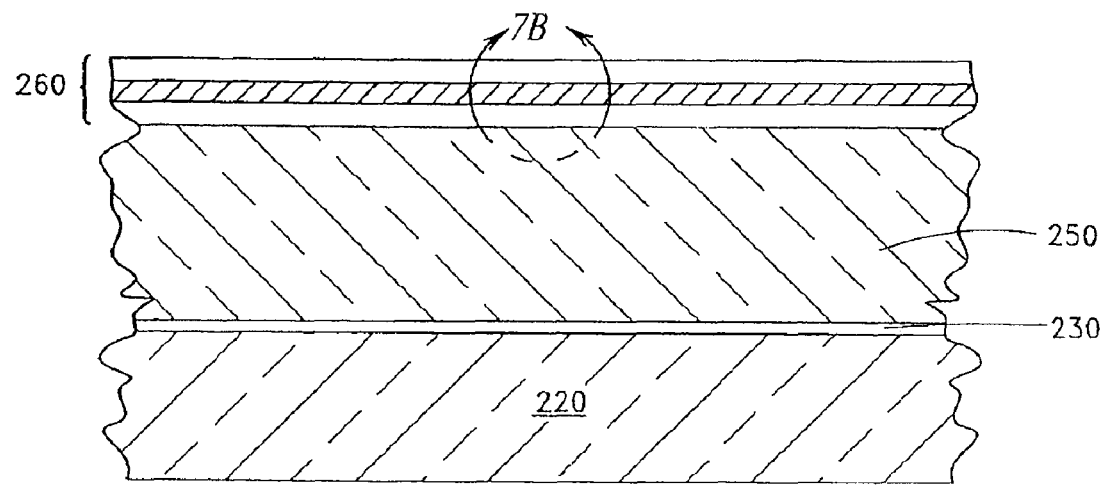
FIGS. 7A and 7B schematically illustrate a partially fabricated stacked gate structure, constructed in accordance with a preferred embodiment of the present invention, including an initial gate dielectric and an initial storage dielectric.
Figure 7B:
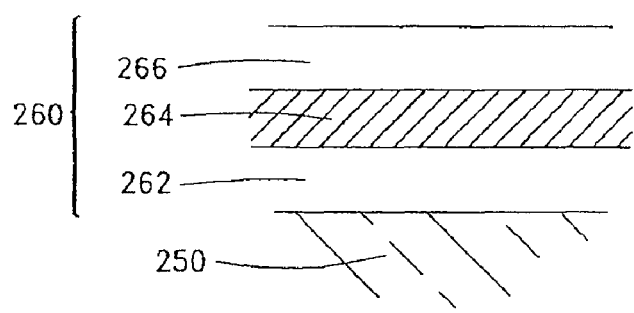

As best seen from FIG. 7B, the formation 130 of the initial storage dielectric layer 260 in the illustrated embodiment comprises formation of an initial lower oxide layer 262, formation of a nitride layer 264 on top of the initial lower oxide layer 262, and formation of an initial upper oxide layer 266 on top of the nitride layer 264. The thickness of the initial lower oxide layer 262, is less than the desired final thickness. Similarly, the thickness of the initial upper oxide layer 266 is less than the desired final thickness.

In the illustrated embodiment, the formation of the initial lower oxide layer 262 comprises thermal oxidation at the upper surface of the floating gate 250. Alternatively, the initial lower oxide layer 262 can be deposited onto the floating gate 250 by CVD, for example. Thermal oxidation growth of an initial lower oxide layer 262 of 20 Å comprises heating the workpiece to approximately 650° C. in an ambient of $O_2$ at a pressure of approximately 760 Torr for a period of between about 2 minutes and 5 minutes. However, persons skilled in the art are able to select alternative values of these parameters or alternative methods of forming the initial lower oxide layer 262, depending upon the desired initial thickness.

The thickness of the initial lower oxide layer 262 is chosen based upon the desired final thickness, but it is preferably between approximately 15 Å and 25 Å for a desired final lower oxide thickness of 40 Å. More generally, the thickness of the initial lower oxide layer 262 is sufficient to serve as a diffusion path for OH species during a later reoxidation, which requires only about 1 or 2 monolayers. Preferably, the thickness of the initial lower oxide layer 262 is between approximately 5% and 95% of the desired final thickness, more preferably between approximately 40% and 60% of the desired final thickness for this layer.

The formation of the silicon nitride layer 264 is accomplished by low pressure chemical deposition vapor (LPCVD), but other embodiments which use other fabrication processes to form the nitride layer 264 are also compatible with the present invention. In the illustrated embodiment, the thickness of the nitride layer at the stage illustrated in FIG. 1 is preferably between approximately 40 Å and 100 Å, and more preferably between approximately 65 Å and 75 Å. More generally, the thickness of the nitride layer 264 at this stage in the fabrication is preferably greater than approximately 150% of the thickness of the nitride layer 64 after the formation of the initial upper oxide layer 266, and more preferably greater than approximately 170% of the thickness of the nitride layer 264 after the formation of the initial upper oxide layer 266.

After formation of the nitride layer 264, the illustrated embodiment includes formation of the initial upper oxide layer 266. In the illustrated embodiment, growth of the initial upper oxide layer 266 is achieved by thermal oxidation at the top of the nitride layer 264, which requires relatively high temperatures and long processing times. The initial upper oxide layer 266 is formed at the expense of the nitride layer 264, which is paritally consumed during oxidation. For example, formation of an initial upper oxide layer 266 that is 20 Å thick will consume approximately 10 Å of the nitride layer 264. Therefore, an initial nitride layer thickness of 40 Å is required to form an initial upper oxide layer 266 that is 20 Å thick and a resultant nitride layer thickness of about 30 Å. Thermal oxidation growth of an initial upper oxide layer 266 of approximately 20 Å thickness can be readily determined by the skilled artisan. Preferably, the prior art process using $H_2O$ and $O_2$ can be adjusted by lowering the temperature and/or duration of the oxidation. Alternatively, other values of these parameters, or other methods of fabrication of the initial upper oxide layer 266 are compatible with the present invention. The thickness of the initial upper oxide layer 266 is chosen based upon the desired final thickness of this layer, but it is preferably between approximately 10 Å and 40 Å, and more preferably between approximately 15 Å and 25 Å. More generally, the initial upper oxide layer 266 is provided in a thickness sufficient to serve as a diffusion path for OH species. Preferably, it has a thickness between approximately 5% and 95% of the desired final thickness, and more preferably between approximately 40% and 60% of the desired final thickness for this layer.

The formation of the gate stack then continues by the formation 140 of a control gate 270 over the initial storage dielectric layer 260. In the illustrated embodiment, the control gate 270 is composed of polysilicon, however, in other embodiments the control gate 270 can be composed of various other conductive materials, including, but not limited to, metal (e.g., tungsten) and/or metal silicide. Upon formation 140 of the control gate 270, a cap insulator layer 280 is preferably formed 150 over the control gate 270, as illustrated in FIG. 8. The cap insulator layer 280 comprising an insulator such as silicon nitride or silicon oxide.

Referring to FIG. 9, the gate stack is then patterned 160, such as by conventional photolithography and etch processes, to define a gate electrode 285. As noted above, vertical etching typically causes some damage to the source/drain regions and the tunnel oxide at the corner of the gate 285.

In the preferred embodiment of the present invention, the patterning of the gate stack is followed by a dilute steam oxidation 170 performed under conditions which form oxide layers at existing oxide-silicon interfaces within the patterned gate electrode 285, with each resulting oxide layer having a substantially uniform thickness across the entire interface. This is accomplished by exposing the patterned gate electrode 285 to elevated temperatures in an ambient which yields OH radicals. In the preferred embodiment of the present invention, this ambient comprises dilute steam ($H_2O$) in a hydrogen flow. However, persons skilled in the art are able to select other chemical constituents which yield OH radicals and are compatible with the present invention. For example, $H_2O_2$ may be used in place of steam, and numerous hydrogen-containing compounds may be used in place of hydrogen (e.g., $NH_3$, $N_2H_4$, or hydrazine). In some arrangements, remote or in situ plasma can also generate OH radicals. The OH radicals react with the silicon atoms at the oxide-silicon interface, converting the silicon atoms into additional oxide species.

Use of dilute steam ambients at relatively low temperatures can result in oxide growth conditions at oxide-conductor interfaces that have a reaction rate limited growth region even for very long diffusion lengths. In particular, OH radicals can quickly diffuse through existing oxide layers, producing a uniform oxidant supply across the oxide-conductor interface. For example, on 0.18 μm wordline flash memory structures, the preferred embodiment of the present invention can grow a substantially uniform oxide underneath the floating gate 250 with substantially no "smile."

As compared to a standard reoxidation step, in which the substrate 220 is exposed to dry oxygen resulting in a "smile" structure, the use of dilute steam ambients to form additional oxide material at an oxide-conductor interface avoids substantial smile due in part to the higher diffusion rate of the OH species from the steam ambient, relative to $O_2$, and in part to the high dilution which lowers the growth rate. In this way, OH species can diffuse to the center of the oxide-silicon interface to grow additional oxide there. This is in contrast to the standard source/drain reoxidation process which utilizes free oxygen and which is unable to form oxide material toward the center of the oxide-silicon interface, and which is deliberately arranged for disproportionate growth. The addition of stable hydrogen compounds to the ambient substantially avoids the creation of other oxygen species (e.g., O or $O_2$) which would otherwise contribute to disproportionate oxide growth at the corners ("smile"). Hydrogen compounds reduce the creation of free oxygen species by providing hydrogen atoms, which maintain the OH species in the dilute steam ambient.

During the dilute steam ambient oxidation 170 of the preferred embodiment of the present invention, the patterned gate electrode 285 is exposed to an ambient comprising steam, hydrogen, and an inert carrier gas such as Ar or $N_2$. The inert carrier serves to dilute $H_2O$ in order to balance the rate of OH diffusion and OH reaction rate to achieve substantially uniform regrowth. In one embodiment of the present invention, the steam is generated by a catalytic process in which $O_2$ molecules impinge upon hydrogen atoms which are bonded to the surface of a catalytic metal surface at an elevated temperature (e.g., approximately 400° C.). Alternatively, the steam may be generated by a pyrogenic process, or by a bubbler. Persons skilled in the art are able to select an appropriate source of steam compatible with the present invention.

Conditions are arranged to moderate the rate of oxidation, relative to the rate of OH diffusion from the gate sidewalls across the dielectric-conductor interface. The pressure of the chamber during the dilute steam ambient oxidation 170 is relatively inconsequential, but is preferably higher than 35 mTorr, and more preferably between approximately 100 Torr and 800 Torr. The partial pressure of steam in this ambient is preferably between approximately 8 Torr and 680 Torr, more preferably between approximately 40 Torr and 160 Torr. More generally, the percentage of the ambient that is $H_2O$ is preferably between approximately 0.1% and 99%, more preferably between approximately 1% and 50%, and most preferably less than about 10%. The temperature of the workpiece during the dilute steam ambient oxidation 170 is preferably between approximately 500° C. and 1,000° C., and more preferably between approximately 600° C. and 800° C., and most preferably between approximately 630° C. and 670° C. As will be readily appreciated by the skilled artisan, in view of the present disclosure, higher temperatures can be compensated by lower steam partial pressures, and vice versa, in order to ensure moderate oxidation rates.

The skilled artisan can readily determine the length of steam exposure required for the desired additional oxide thickness.

FIGS. 10A to 10C schematically illustrate the resulting structure after the dilute steam ambient oxidation 170. Under the preferred conditions, additional oxide is formed at each oxide-silicon interface with a substantially uniform thickness across the entire interface (i.e., no smile), producing a final gate oxide 230' with an enhanced thickness and passivated grain boundaries. The amount of additional oxide formation is dependent on the exposure time of the dilute steam ambient oxidation 170 and on the other process parameters such as pressure and temperature. The difference between the maximum and minimum thickness of the final tunnel dielectric layer 230' is preferably no more than about 8 Å, more preferably no more than about 4 Å.

In an exemplary dilute steam oxidation, an initial tunnel dielectric layer 230 of approximately 90 Å is formed using one of the standard techniques known to persons skilled in the art. After formation and patterning of the rest of the gate stack, the device is held at an elevated temperature of about 650° C. while being exposed to an ambient of approximately 760 Torr with 10% steam and 90% hydrogen. After approximately 30 minutes of this dilute steam ambient oxidation 170, approximately 10 Å to 20 Å of additional oxide is formed resulting in the final tunnel dielectric layer 230' of 100 Å to 110 Å with substantially no smile.

Concurrently with the growth of additional oxide at the initial tunnel dielectric layer 230, in the preferred embodiment of the present invention, the dilute steam ambient oxidation 170 yields additional oxide at other oxide-silicon interfaces of the gate electrode 285 (e.g., the oxide layers of the ONO initial storage dielectric layer 260). For example, after forming an initial storage dielectric layer 260 comprising an initial lower oxide layer 262 of approximately 20 Å, a nitride layer 264 of approximately 30 Å, and an initial upper oxide layer 266 of approximately 20 Å, the dilute steam ambient oxidation 170 using the above-described set of parameters adds approximately 20 Å to each oxide-silicon interface during the process. The resulting final storage dielectric layer 260' then has a lower oxide layer 262' of 40 Å, a final nitride layer 264' of 30 Å, and an upper oxide layer 266' of 40 Å.

In other embodiments of the present invention, larger fractions of the final tunnel dielectric layer 230' or the final storage dielectric layer 260' may be formed using the dilute steam ambient oxidation 170. As noted, the initial oxide layers are preferably between about 5% and 95% of the respective final desired thicknesses. To form additional oxide during the dilute steam ambient oxidation 170, the previously fabricated initial oxide layer serves as the diffusion path for the OH species. OH radicals do not diffuse through silicon sufficiently fast to produce oxide layers with substantially uniform thicknesses.

In certain embodiments of the present invention, the use of the dilute steam ambient oxidation 170 to form a fraction of the final storage dielectric layer 260' represents a substantial savings of the thermal budget associated with the formation of the gate electrode 285. Conventional formation of a 40 Å thick upper oxide layer of an ONO storage dielectric layer entails substantial oxidation of the nitride layer, requiring temperatures in excess of 900° C. for times as long as four hours, which represents a significant thermal load and process time overhead. In addition, during this long thermal process, oxygen species can diffuse to the tunnel oxide interface and cause defects. Conversely, the formation of the final upper oxide layer 266' using the dilute steam ambient oxidation 170 only requires the prior formation of an OH diffusion path from the gate sidewalls to the center thereof. High temperatures need only be maintained long enough to generate an initial upper oxide layer 266 (FIG. 7B) with a minimal thickness of about one monolayer (e.g., 6-10 Å). The remainder of the final upper oxide layer 266' (FIG. 10B) can then be added more quickly and without as high a thermal load by dilute steam oxidation. Such a reduction of the thermal budget equates to a substantial reduction in the number of charge traps generated in the final tunnel dielectric layer 230'. Therefore, use of the dilute steam ambient oxidation 170 to fabricate the oxide layers of the gate electrode 285 yields devices with improved performance properties, as compared to devices fabricated using conventional techniques.

By providing additional oxide at existing oxide-silicon interfaces, the steam ambient oxidation 170 contributes to the repair of defects at these oxide-silicon interfaces, thereby improving the ultimate device performance. For example, the elevated temperatures and long process times associated with the fabrication of the remaining components of the gate electrode 285 induce vacancies and dangling bonds in the initial tunnel dielectric layer 230. If left unrepaired, these defects can act as charge traps, degrading the ultimate performance of the flash device. However, by exposing the patterned gate electrode 285 to the dilute steam ambient, OH radicals are able to diffuse to these defects to fill the oxygen vacancies and tie up the dangling bonds in the region of the final tunnel dielectric layer 260'. Therefore, the defect density at the final tunnel dielectric layer 260' is reduced, with a corresponding increase in the performance of the flash memory device. In certain arrangements, the dilute steam ambient oxidation 170 is the last chance to repair the defects at the oxide-silicon interfaces before the gate electrode 285 is encapsulated in a liner layer, and a thick BPSG insulating layer.

Figure 11:
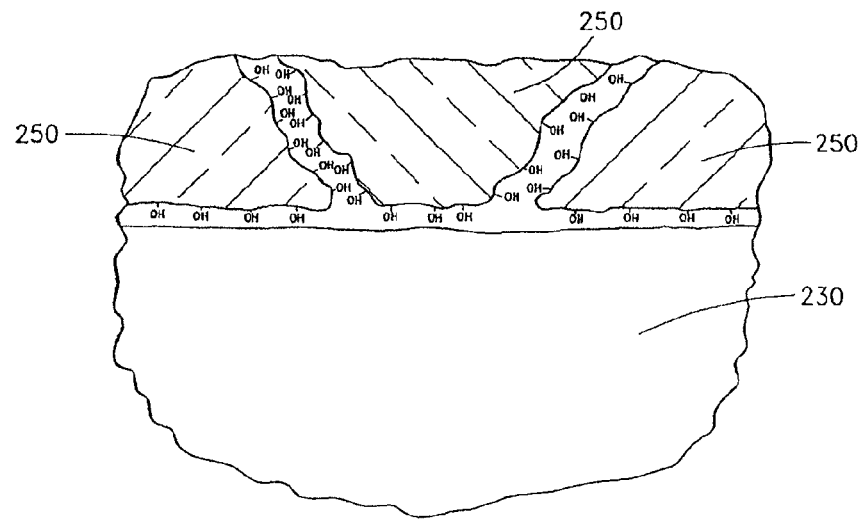
FIG. 11 schematically illustrates the polysilicon grain boundaries at the gate dielectric-polysilicon interface after exposure to a dilute steam ambient.

At the same time, where the gate electrodes comprise crystalline material like the preferred polysilicon, the dilute steam ambient oxidation 170 passivates the grain boundaries in the polysilicon layers of the gate electrode 285. FIG. 11 schematically illustrates these grain boundaries in a polysilicon layer at an oxide-polysilicon interface. The erase speed in flash memory devices is observed to be a strong function of the grain size (or equivalently, the grain number) of the floating gate 250 in contact with the final tunnel dielectric layer 230'. For smaller grain sizes (or more numerous grains), the erase speed has been observed to be faster than for larger grain sizes (or less numerous grains). This result indicates that the erasure charge transfer through the polysilicon occurs substantially along the grain boundaries, possibly via the numerous defects and interface states along these grain boundaries. Thus, processes which form patterned gate electrode 285 with widely varying grain sizes may be subject to non-uniform erasure, and correspondingly varying flash memory device operation. The dilute steam ambient oxidation 170 of the preferred embodiment of the present invention can passivate the grain boundaries of the polysilicon floating gate 250 by forming oxide bonds along the grain boundaries, as schematically illustrated in FIG. 11, thereby eliminating grain size or number as an erase variable. Therefore, the dilute steam ambient oxidation 170 may be used in certain embodiments to achieve more uniform erasure characteristics among various flash memory devices.

In other embodiments, process parameters may be adjusted in order to induce some amount of smile in the oxide layers formed during the dilute steam ambient oxidation 170. Under some circumstances, a non-negligible smile of the final tunnel dielectric layer 230' is advantageous to the ultimate device performance. For example, such a smile structure of the final tunnel dielectric layer 230' effectively rounds the edges and corners of the polysilicon floating gate 250, thereby reducing the electric field in these regions. As a result, better channel control and less hot electron degradation is achieved, and the threshold voltage of the flash memory device can be adjusted. For a dilute steam ambient with 3.5% steam in 3 slm $H_2$, different temperatures and exposure times produce varying amount of smile in the final tunnel dielectric layer 230' as shown in Table 1:

| Time (Minutes) | Temperature (° C.) | Center Oxide Thickness (Å) | Edge Oxide Thickness (Å) |
|---|---|---|---|
| 105 | 750 | 11 | 31 |
| 189 | 700 | 26 | 47 |
| 363 | 650 | 64 | 68 |

Figure 12:
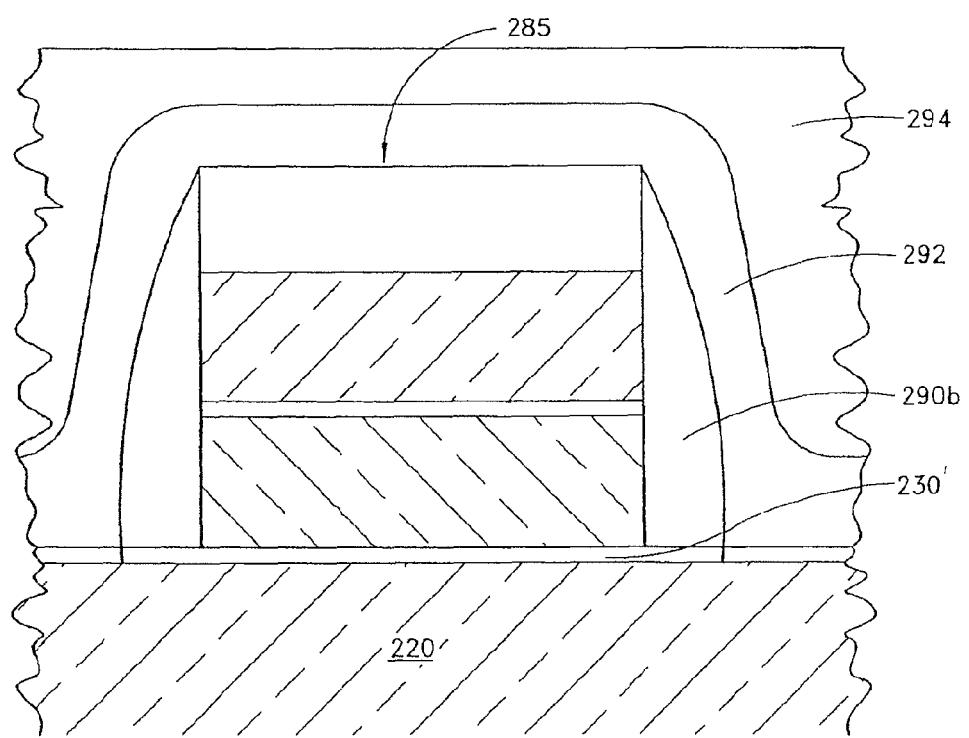
FIG. 12 schematically illustrates the patterned gate of FIG. 10A after formation of spacers and further insulating layers over the gate electrode.

In the preferred embodiment of the present invention, the fabrication of the flash memory devices continues with subsequent processing steps, as illustrated in FIG. 12. Spacers 290a and 290b are formed along the sidewalls of the patterned gate electrode 285 after the dilute ambient oxidation. Conventional blanket deposition of an insulating material followed by a directional spacer etch can be employed for spacer formation. Doping of the underlying silicon substrate 220, thereby creating the source and drain regions of the flash memory device, can be performed after formation of the spacers 290a and 290b.

The gate electrode 285 and other surrounding areas are then covered by a substantially conformal liner layer 292. The liner 292 comprises an insulating material, preferably incorporating both silicon and nitrogen. Preferred liner materials include silicon oxide, silicon nitride, silicon oxynitride or a multiple layer laminate including one or both of nitride and oxynitride. The liner 292 can be formed by any suitable manner, but is preferably formed by chemical vapor deposition (CVD) to ensure good step coverage over the topography of the patterned stacked gate structures 26 across the substrate 20.

Subsequent to forming the liner layer 292 in the preferred embodiment of the present invention, an interlevel insulating layer 294 is deposited over the structure. Typically composed of BPSG, the layer 294 serves to electrically isolate underlying devices, such as the illustrated EEPROM transistor. From overlying interconnects. Accordingly, the interlevel insulating layer 294 is preferably between about 6,000 Å and 20,000 Å in thickness.

After depositing the interlayer insulating layer 294, the integrated circuit is completed by additional fabrication steps. Typically, such steps include metallization processes, interconnecting various devices of the integrated circuit. In order to make contact electrical contact between metal layers and the electronic devices, holes or vias are etched through the interlevel dielectric layers, such as the interlevel insulating layer 294, and then filled with conductive material. Contact to the control gate 270 and active areas in the substrate 220, for example, require contact through the interlevel insulating layer 294 and the liner layer 292.

After metallization steps, the integrated circuit is then completed by formation of bond pads and final passivation, such as by deposition of a further silicon oxynitride layer or other suitable passivation material. As will be appreciated by the skilled artisan, the passivation layer forms a seal against moisture or other corrosive agents.

Although described above in connection with particular embodiments of the present invention, it should be understood the descriptions of the embodiments are illustrative of the invention and are not intended to be limiting. Various modifications and applications may occur to those skilled in the art without departing from the true spirit and scope of the invention as defined in the appended claims.

What is claimed is:

1. A memory cell comprising:
   a tunnel dielectric;
   a floating gate; and
   oxidized portions extending substantially uniformly along an electrode-dielectric interface between the tunnel dielectric and the floating gate,
   wherein the tunnel dielectric layer has a minimum thickness and a maximum thickness, the maximum thickness being no more than approximately 8 Angstroms larger than the minimum thickness.

2. The memory cell of claim 1, wherein the tunnel dielectric has a substantially uniform thickness across the entire electrode-dielectric interface.

3. The memory cell of claim 1, wherein the tunnel dielectric comprises an oxide, the floating gate comprises polysilicon, and the oxidized portions comprise passivated portions.

4. The memory cell of claim 1, wherein the maximum thickness is no more than approximately 4 Angstroms larger than the minimum thickness.

5. A memory cell comprising:
   a storage dielectric layer;
   a floating gate layer; and
   oxidized portions extending substantially uniformly along a first electrode-dielectric interface between the floating gate layer and the storage dielectric layer,
   wherein the storage dielectric layer comprises a lower oxide layer at an upper surface of the floating gate, a nitride layer on top of the lower oxide layer, and an upper oxide layer on top of the nitride layer.

6. The memory cell of claim 5, further comprising a control gate layer comprising polysilicon, and second oxidized portions extending substantially uniformly along a second electrode-dielectric interface between the control gate layer and the upper oxide layer.

7. The memory cell of claim 5, wherein the thickness of the lower oxide layer is approximately 40 Angstroms.

8. The memory cell of claim 5, wherein the thickness of the nitride layer is approximately 30 Angstroms and the thickness of the upper oxide layer is approximately 40 Angstroms.

9. A memory cell, comprising:
   means for storing charge; and
   means for transferring charge to and from the storing means; and
   oxidized portions extending substantially uniformly along an interface between the storing means and the transferring means; and
   means for controlling the transfer of charge to the storing means and from the storing means.

10. The memory cell of claim 9, wherein the storing means comprises a floating gate layer.

11. The memory cell of claim 9, wherein the transferring means comprises a tunnel dielectric layer.

12. The memory cell of claim 9, wherein the controlling means comprises a control gate layer.

13. The memory cell of claim 9, further comprising means for electrically isolating the storing means from the controlling means.

14. The memory cell of claim 13, wherein the electrically isolating means comprises a storage dielectric layer.

* * * * *